(12) United States Patent
Kwan et al.

(10) Patent No.: US 10,411,681 B2
(45) Date of Patent: Sep. 10, 2019

(54) SEMICONDUCTOR DEVICE AND CIRCUIT PROTECTING METHOD

(71) Applicant: Taiwan Semiconductor Manufacturing Company, Ltd., Hsinchu (TW)

(72) Inventors: Man-Ho Kwan, Kowloon (HK); Fu-Wei Yao, Hsinchu (TW); Ru-Yi Su, Yunlin County (TW); King-Yuen Wong, Tuen Mun (HK)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/863,229

(22) Filed: Jan. 5, 2018

(65) Prior Publication Data

US 2018/0145669 A1 May 24, 2018

Related U.S. Application Data

(63) Continuation of application No. 15/259,976, filed on Sep. 8, 2016, now Pat. No. 9,882,553.

(60) Provisional application No. 62/269,618, filed on Dec. 18, 2015.

(51) Int. Cl.
*H03K 5/08* (2006.01)
*H01L 27/088* (2006.01)
*H01L 29/778* (2006.01)

(52) U.S. Cl.
CPC ........... *H03K 5/08* (2013.01); *H01L 27/0883* (2013.01); *H01L 29/778* (2013.01)

(58) Field of Classification Search
CPC ...... H03K 5/08; H01L 27/0883; H01L 29/778
USPC .................................................. 327/306–333
See application file for complete search history.

(56) References Cited

U.S. PATENT DOCUMENTS

| | | | |
|---|---|---|---|
| 3,603,813 | A | 9/1971 | Hall |
| 3,714,466 | A | 1/1973 | Spence |
| 5,079,608 | A | 1/1992 | Wodarczyk et al. |
| 6,351,158 | B1 * | 2/2002 | Shearon ........... H03K 19/00315 326/22 |
| 7,594,198 | B2 | 9/2009 | Chen |
| 7,636,005 | B2 | 12/2009 | Nadd |
| 7,701,296 | B2 | 4/2010 | Inoue et al. |
| 8,324,658 | B2 | 12/2012 | Tsai et al. |
| 8,334,571 | B2 | 12/2012 | Tsai et al. |
| 8,541,848 | B2 | 9/2013 | Huang et al. |
| 8,730,626 | B2 | 5/2014 | Tseng et al. |
| 8,743,515 | B2 | 6/2014 | Yang et al. |
| 8,759,871 | B2 | 6/2014 | Song et al. |

(Continued)

FOREIGN PATENT DOCUMENTS

| | | |
|---|---|---|
| TW | 200514233 | 4/2005 |
| TW | 201310618 | 3/2013 |
| TW | 201413910 | 4/2014 |

*Primary Examiner* — Dinh T Le
(74) *Attorney, Agent, or Firm* — Haynes and Boone, LLP

(57) ABSTRACT

A device includes a first transistor having a first source terminal, a first drain terminal, and a first gate terminal; and a second transistor having a second source terminal, a second drain terminal, and a second gate terminal. The second source terminal is coupled to the first gate terminal and the first source terminal is coupled to the second gate terminal. The first transistor has a first threshold voltage, and the second transistor has a second threshold voltage different from the first threshold voltage.

20 Claims, 8 Drawing Sheets

(56) References Cited

U.S. PATENT DOCUMENTS

| | | |
|---|---|---|
| 8,760,828 B2 | 6/2014 | Ma |
| 8,792,218 B2 | 7/2014 | Tsai |
| 8,854,778 B2 | 10/2014 | Chu et al. |
| 8,867,183 B2 | 10/2014 | Chen et al. |
| 8,896,131 B2 | 11/2014 | Bhalla et al. |
| 8,994,454 B2 | 3/2015 | Murakami |
| 9,035,393 B2 | 5/2015 | Ma et al. |
| 9,048,655 B2 | 6/2015 | Meng et al. |
| 9,069,924 B2 | 6/2015 | Chen |
| 9,117,677 B2 | 8/2015 | Ma et al. |
| 9,160,326 B2 * | 10/2015 | Chen ................ H03K 17/08104 |
| 9,184,586 B2 | 11/2015 | Wang et al. |
| 9,214,540 B2 | 12/2015 | Tsai et al. |
| 9,270,105 B2 | 2/2016 | Ko et al. |
| 9,305,961 B2 * | 4/2016 | Wang ................ H01L 27/14618 |
| 2005/0083620 A1 | 4/2005 | Lin et al. |
| 2013/0119433 A1 | 5/2013 | Wang |
| 2014/0175611 A1 | 6/2014 | Hsu |
| 2014/0217461 A1 | 8/2014 | Song et al. |
| 2014/0226241 A1 | 8/2014 | Tseng et al. |
| 2014/0307355 A1 | 10/2014 | Tsai et al. |
| 2017/0179935 A1 | 6/2017 | Kwan et al. |

* cited by examiner

SEMICONDUCTOR DEVICE AND CIRCUIT PROTECTING METHOD

PRIORITY

This is a continuation of U.S. patent application Ser. No. 15/259,976, filed Sep. 8, 2016, which claims the benefits of U.S. Provisional Application No. 62/269,618, filed Dec. 18, 2015. The entire disclosure of these applications is incorporated herein by reference.

BACKGROUND

A power device is used to output a high power signal. For example, the power device may be integrated in a transmitter for driving a large power transmitting signal. The power device may also be integrated in a power switching device. Although a power device is designed to deal with the large power signal, the power device may still be destructed by a high voltage spike. The high voltage spike may cause a transient high current in the power device, which may breakdown the power device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
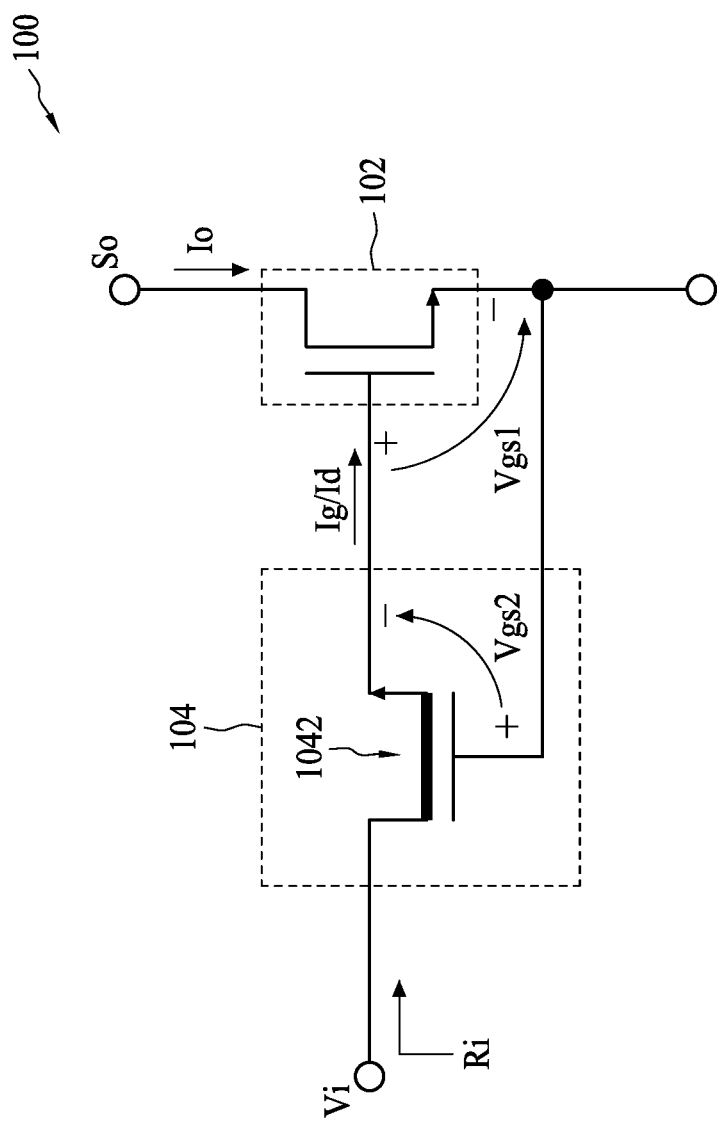
FIG. 1 is a circuit diagram of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a circuit diagram of a semiconductor device 100 in accordance with some embodiments. The semiconductor device 100 may include a voltage driven device. The voltage driven device may be a high voltage power device. However, this is not a limitation of the present disclosure. The voltage driven device may be a low, or normal voltage power device, e.g., a device with appropriate voltage. The high voltage power device may be a transistor capable of generating a signal with voltage higher than 40V (Volts). For example, the high voltage power device may be a group III-V device. The group III-V device refers to a compound semiconductor that includes at least one group III element and at least one group V element, such as, but not limited to, gallium nitride (GaN), gallium arsenide (GaAs), indium aluminum gallium nitride (InAlGaN), indium gallium nitride (InGaN) and the like. Referring to FIG. 1, the semiconductor device 100 comprises a transistor 102 and a clamping circuit 104. The transistor 102 is arranged to generate an output signal So according to a control signal Vgs1. The clamping circuit 104 is arranged to generate the control signal Vgs1 according to an input signal Vi, and to clamp the control signal Vgs1 at a predetermined signal level Vp (see FIG. 2) when the input signal Vi exceeds the predetermined signal level Vp. Depending on the application, the clamping circuit 104 may clamp the control signal Vgs1 at the predetermined signal level Vp when the input signal Vi is higher or lower than the predetermined signal level Vp. In the present embodiment, the clamping circuit 104 comprises a second transistor 1042. The transistor 102 and the transistor 1042 may be group III-V transistors. In some embodiments, the transistor 102 is an enhancement-mode high-electron-mobility transistor (E-HEMT) and the transistor 1042 is a depletion-mode high-electron-mobility transistor (D-HEMT). However, this is not a limitation of the embodiments. Other types of transistors are within the scope of the disclosure.

In some embodiments, a first connecting terminal of the transistor 1042 is arranged to receive the input signal Vi. In addition, the first connecting terminal may be a drain terminal of the transistor 1042. A second connecting terminal of the transistor 1042 is arranged to couple to a gate terminal of the transistor 102 in order to output the control signal Vgs1 to the gate of the transistor 102. Furthermore, the second connecting terminal may be a source terminal of the transistor 1042. A first connecting terminal of the transistor 102 is arranged to output the output signal So. In addition, the first connecting terminal may be a drain terminal of the transistor 102. A second connecting terminal of the transistor 102 is arranged to couple to a gate terminal of the transistor 1042. Furthermore, the second connecting terminal may be a source terminal of the transistor 102. In some embodiments, an input circuit may be coupled to the drain terminal of the transistor 1042, an output or loading circuit may be coupled to the drain terminal of the transistor 102, and a loading circuit may be coupled to the source terminal of the transistor 102. These circuits are omitted here for brevity.

For illustrative purposes, however, the source terminal of the transistor 102 is coupled to a reference voltage such as the ground voltage, and the input signal Vi is a voltage between the drain terminal of the transistor 1042 and the ground voltage. The control signal Vgs1 is a voltage drop between the gate terminal of the transistor 102 and the source terminal of the transistor 102. In some embodiments, the transistor 1042 is arranged to clamp the control signal Vgs1 at the predetermined signal level Vp when the input signal Vi is higher than the predetermined signal level Vp.

As the transistor 102 is E-HEMT and the transistor 1042 is D-HEMT, the transistor 102 and the transistor 1042 have different threshold voltages. Accordingly, the threshold voltage Vth1 of the transistor 102 is different from the threshold voltage Vth2 of the transistor 1042. In some embodiments, the threshold voltage of a field-effect transistor (FET) is the minimum gate-to-source voltage drop needed to create a conducting path between the source and drain terminals of the FET. The threshold voltages of an E-HEMT and a D-HEMT have different polarity. For example, the threshold voltage of an E-HEMT is a positive voltage while the threshold voltage of a D-HEMT is a negative voltage. Therefore, the threshold voltage Vth1 is a positive voltage and the threshold voltage Vth2 is a negative voltage.

In some embodiments, the source terminal and the gate terminal of the transistor 1042 are coupled to the gate terminal and the source terminal of the transistor 102, respectively. Effectively, the bias voltage between the gate-source terminals of the transistor 102 is opposite to the bias voltage between the gate-source terminals of the transistor 1042. When the input signal Vi is higher than the predetermined signal level Vp, the control signal Vgs1 and the gate current Ig of the transistor 102 will be clamped at the predetermined signal level Vp and a predetermined current Ip, respectively.

In some embodiments, it is assumed that the voltage drop from the gate terminal to the source terminal of the transistor 1042 is Vgs2, then the relation between the gate-source voltages of the transistor 102 and the transistor 1042 can be expressed by the following equation (1):

$$Vgs1 = -Vgs2 \quad (1).$$

When the gate current Ig of the transistor 102 is equal to the drain current Id of the transistor 1042, equation (2) can be obtained below:

$$Ig \approx Ae^{\frac{qVgs1}{kT}} \approx B(Vgs2 - Vth2)^2 \approx Id. \quad (2)$$

Then, equation (3) can be obtained based on equations (1) and (2):

$$Ig \approx Ae^{\frac{qVgs1}{kT}} \approx B(Vgs1 + Vth2)^2 \approx Id. \quad (3)$$

The parameter A is the gain factor of the transistor 102 while the parameter B is the gain factor of the transistor 1042. The parameter q represents the elementary charge of the majority carriers of the transistors 102 and 1042. The parameter k is the Boltzmann constant. The parameter T represents temperature.

According to the equation (3), the control signal Vgs1 can be solved. When the gate current Ig of the transistor 102 is equal to the drain current Id of the transistor 1042, the control signal Vgs1 is regarded as the predetermined signal level Vp, and the predetermined signal level Vp is a fixed value and depends on the parameters A, B, q, k, T, and Vth2. In other words, the predetermined signal level Vp depends on the threshold voltage Vth2 of the transistor 1042 when the parameters A, B, q, k, and T are fixed values.

Figure 2:
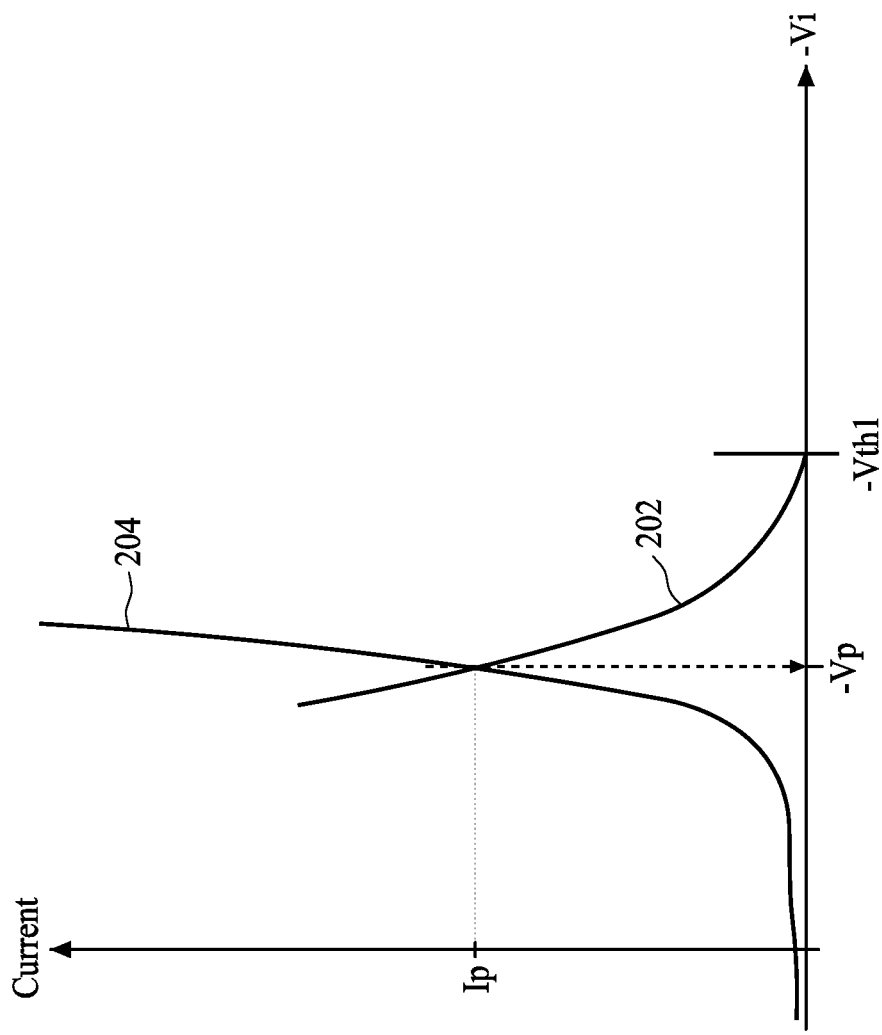
FIG. 2 is a diagram illustrating the characteristics of a gate current of a first transistor and a drain current of a second transistor of the semiconductor device in FIG. 1 in accordance with some embodiments.

FIG. 2 is a diagram illustrating the characteristics of the gate current Ig of the transistor 102 and the drain current Id of the transistor 1042 in accordance with some embodiments. Curve 202 represents the load line of the gate current Ig of the transistor 102. Curve 204 represents the load line of the drain current Id of the transistor 1042. When the gate current Ig of the transistor 102 equals the drain current Id of the transistor 1042, i.e. when the gate current Ig and the drain current Id are equal to the predetermined current Ip, the control signal Vgs1 is clamped at the predetermined signal level Vp. In other words, when the input signal Vi continues to increase, the control signal Vgs1 and the gate current Ig of the transistor 102 will continuously be clamped at or locked to the predetermined signal level Vp and the predetermined current Ip, respectively.

In some embodiments, when the transistor 1042 is turned on, the path between the drain terminal and the source terminal of the transistor 1042 is conducted. As a result, the voltage drop between the drain terminal and the source terminal of the transistor 1042 is relatively small and thus can be omitted. Therefore, the input signal Vi substantially equals the control signal Vgs1 when the transistor 1042 is turned on.

When the input signal Vi exceeds the predetermined signal level Vp, the voltage drop, i.e. Vgs1, between the gate terminal of the transistor 102 and the source terminal of the transistor 102 is higher than the threshold voltage Vth1, and the voltage drop, i.e. Vgs2, between the gate terminal of the transistor 1042 and the source terminal of the transistor 1042 is smaller than the threshold voltage Vth2. In some embodiments, when the input signal Vi is smaller than the predetermined signal level Vp, the transistor 102 and the transistor 1042 are turned on. When the input signal Vi is higher than the predetermined signal level Vp, the transistor 102 is turned on and the transistor 1042 is turned off. The transistor 1042 is turned off because the voltage drop, i.e. Vgs2, between the gate terminal and the source terminal of the transistor 1042 is smaller than the threshold voltage Vth2. When the transistor 1042 is turned off, the control signal Vgs1 is clamped at the predetermined signal level Vp. Therefore, the control signal Vgs1 of the transistor 102 is clamped by the threshold voltage Vth2 of the transistor 1042.

Accordingly, when a high voltage spike is inputted to the clamping circuit 104 (i.e. the drain terminal of the transistor 1042), the clamping circuit 104 will limit the maximum control signal Vgs1 and the maximum gate current Ig of the transistor 102 to the predetermined signal level Vp and the predetermined current Ip, respectively to protect the transistor 102.

Moreover, an input resistance Ri of the clamping circuit 104 is defined as a resistance looking into the drain terminal of the transistor 1042. The input resistance Ri is dependent on the input current (i.e. the gate current Ig or the drain current Id) inputting to the clamping circuit 104. For example, the input resistance Ri is inversely proportional to the drain current Id of the transistor 1042. The drain current Id may be controlled by the gate width Wg of the transistor 1042. When the gate width Wg of the transistor 1042 is adjusted, the threshold voltage Vth2 of the transistor 1042 is kept intact because the threshold voltage Vth2 of the transistor 1042 is independent on the gate width Wg of the transistor 1042. Accordingly, the gate width Wg of the transistor 1042 can be optimized to minimize the input resistance Ri of the clamping circuit 104 without affecting the predetermined signal level Vp. The predetermined signal level Vp is dependent on the threshold voltage Vth2 of the transistor 1042 as mentioned in the above paragraph.

In some other approaches, the gate terminal of the transistor 1042 is connected to the gate terminal of the transistor 102 instead of connected to the source terminal of the transistor 102. In these approaches, the clamped current of the transistor 1042 is decided by the gate width of the transistor 1042. In other words, the gate width of the transistor 1042 should be relatively small in order to clamp the gate current of the transistor 102 to a relatively small current. However, when the gate width of the transistor 1042 is relatively small, the input resistance looking into the gate terminal of the transistor 102 is relatively high. Accordingly, in comparison to these approaches, the embodiment in FIG. 1 has better performance in terms of input resistance.

Figure 3:
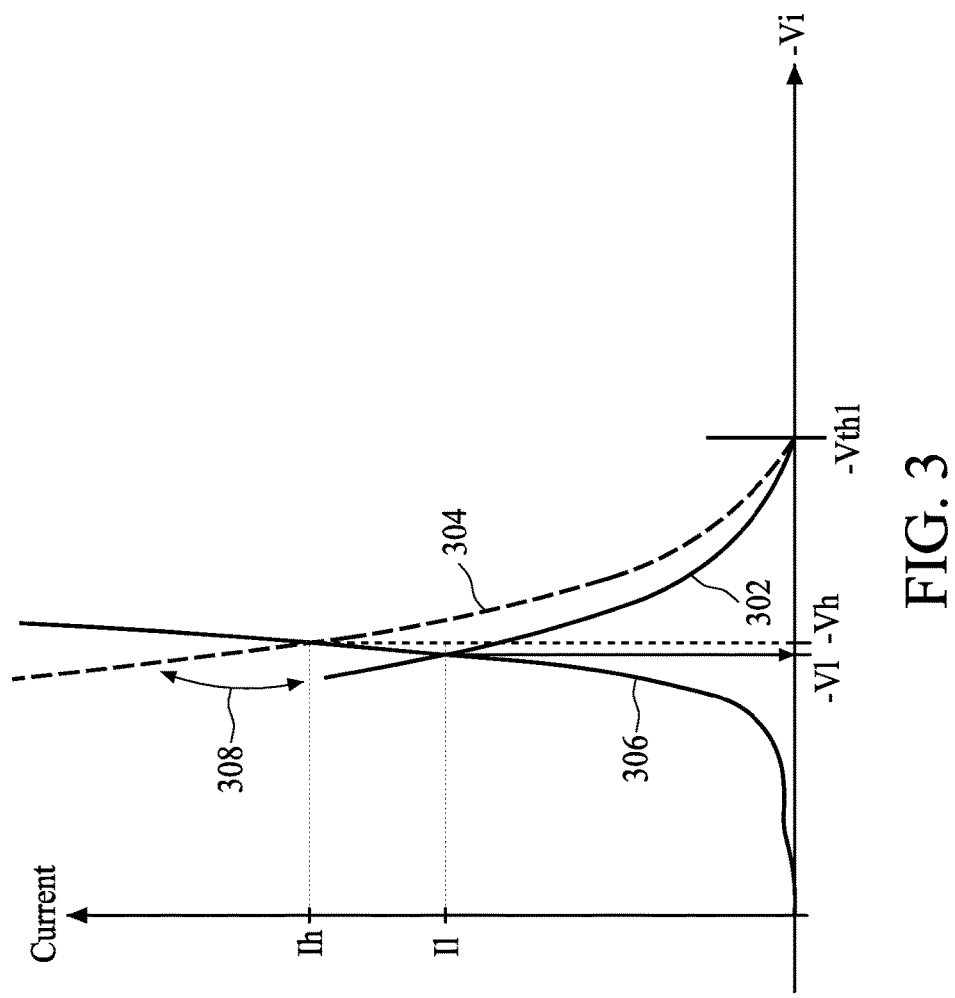
FIG. 3 is a diagram illustrating the variation of the characteristics of a gate current of a first transistor and a drain current of a second transistor of the semiconductor device in FIG. 1 in accordance with some embodiments.

In some embodiments, as the load line of the gate current Ig of the transistor 102 exhibits an exponential characteristic in response to the control signal Vgs1, the variation of the gate current Ig of the transistor 102 also exhibits the exponential characteristic when the gate width Wg of the transistor 1042 is changed. As a result, the predetermined signal level Vp only introduces a minor variation when the gate width Wg of the transistor 1042 is changed as shown in FIG. 3. FIG. 3 is a diagram illustrating the variation of the characteristics of the gate current Ig of the transistor 102 and the drain current Id of the transistor 1042 in accordance with some embodiments. Curve 302 represents the load line of the gate current Ig of the transistor 102 with respect to a first gate width Wg1 of the transistor 1042. Curve 304 represents the load line of the gate current Ig of the transistor 102 with respect to a second gate width Wg2 of the transistor 1042. Curve 306 represents the load line of the drain current Id of the transistor 1042. The second gate width Wg2 is larger than the first gate width Wg1. When the gate width Wg of the transistor 1042 is designed with a large gate width, e.g. Wg2, the control signal Vgs1 and the gate current Ig of the transistor 102 are clamped at the signal level Vh and the current Ih, respectively. When the gate width Wg of the transistor 1042 is designed with a small gate width, e.g. Wg1, the control signal Vgs1 and the gate current Ig of the transistor 102 are clamped at the signal level Vl and the current Il, respectively. The signal level Vh is very close to the signal level Vl. However, the current Ih is far from the current Il because the variation between the current Ih and the current Il is exponential when the gate width Wg of the transistor 1042 is changed. In FIG. 3, the two arrows line 308 illustrates the exponential variation between the curve 302 and the curve 304 in response to the variation of the gate width Wg of the transistor 1042. In other words, the variation of the gate width Wg of the transistor 1042 only introduces a minor change in the predetermined signal level Vp of the transistor 102 but introduces a large change in the predetermined current Ip. Therefore, when the gate width Wg of the transistor 1042 is adjusted, e.g. designed with a large gate width, to minimize the input resistance Ri of the semiconductor device 100, the gate width adjustment does not introduce a large variation in the clamping voltage, i.e. the predetermined signal level Vp, of the clamping circuit 104. In some embodiments, the gate width adjustment of the transistor 1042 does not vary the threshold voltage Vth2 of the transistor 1042.

In some embodiments, the transistor 102 and the clamping circuit 104 are integrated into a single chip. The transistor 102 and the clamping circuit 104 may be fabricated by the same semiconductor fabricating process. However, this is not a limitation of the embodiments. The transistor 102 and the clamping circuit 104 may be fabricated as discrete devices.

Figure 4:
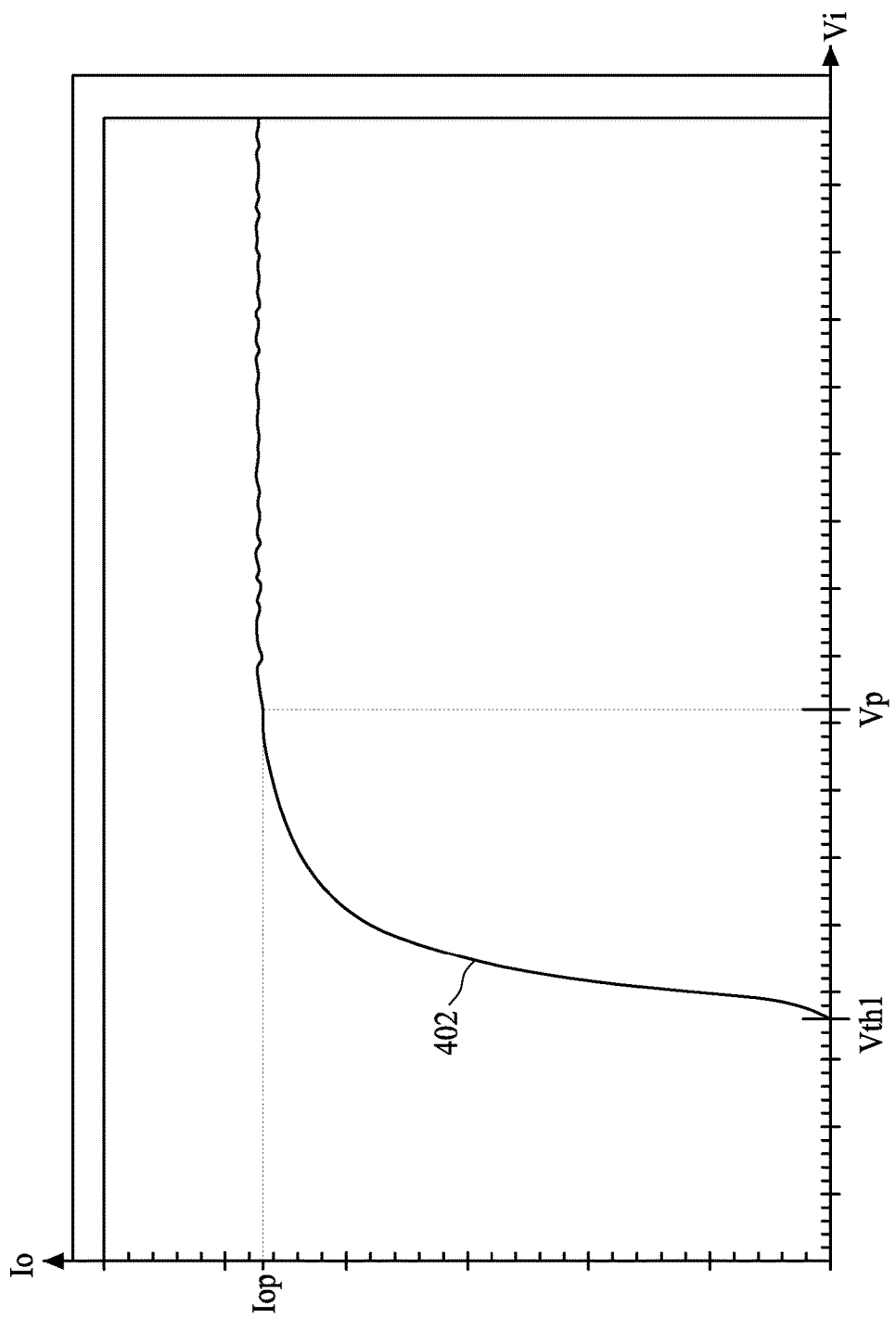
FIG. 4 is a diagram illustrating a drain current of the semiconductor device in FIG. 1 in accordance with some embodiments.

FIG. 4 is a diagram illustrating the current Io of the semiconductor device 100 in accordance with some embodiments. The current Io is the drain current of the transistor 102. Curve 402 represents the variation of the drain current Io of the transistor 102 with respect to the input signal Vi. When the input signal Vi is smaller than the predetermined signal level Vp, the transistor 1042 is turned on, and the voltage drop between the drain terminal and the source terminal of the transistor 1042 can be omitted. When the input signal Vi is larger than the threshold voltage Vth1, the transistor 102 is turned on, and the control signal Vgs1 substantially equals the input signal Vi. The drain current Io is proportional to the input signal Vi when the input signal Vi is between the threshold voltage Vth1 and the predetermined signal level Vp.

When the input signal Vi is larger than the predetermined signal level Vp, the transistor 1042 is turned off. When the transistor 1042 is turned off, the control signal Vgs1 is clamped at the predetermined signal level Vp and the drain current Io is clamped at a predetermined output current Iop. In other words, when the input signal Vi is larger than the predetermined signal level Vp, the drain current Io is fixed to the predetermined output current Iop and does not vary with respect to the input signal Vi. Accordingly, when the high voltage spike occurs, the transistor 102 does not instantly generate a large output current to breakdown the semiconductor device 100.

In FIG. 1, the transistor 102 is an N-type E-HEMT and the transistor 1042 is an N-type D-HEMT. However, this is not a limitation of the embodiments. In some embodiments, the transistor 102 may be an N-type E-HEMT and the transistor 1042 may be a P-type D-HEMT. In some embodiments, the transistor 102 may be a P-type E-HEMT and the transistor 1042 may be an N-type D-HEMT. In some embodiments, the transistor 102 may be a P-type E-HEMT and the transistor 1042 may be a P-type D-HEMT. In some embodiments, the transistor 102 and the transistor 1042 comprise vertical layered heterostructures, in which the vertical layered heterostructures are implemented by group-III nitride (also referred to as III-nitride or III-N) semiconductor material. In some embodiments, the transistor 102 may be an N-type field-effect transistor and the transistor 1042 may be a P-type field-effect transistor. In some embodiments, the transistor 102 may be a P-type field-effect transistor and the transistor 1042 may be an N-type field-effect transistor. In some embodiments, the transistor 102 may be a P-type field-effect transistor and the transistor 1042 may be a P-type field-effect transistor. In some embodiments, the transistor 102 may be an NPN bipolar junction transistor and the transistor 1042 may be a PNP bipolar junction transistor. In some embodiments, the transistor 102 may be a PNP bipolar junction transistor and the transistor 1042 may be an NPN bipolar junction transistor. In some embodiments, the transistor 102 may be a PNP bipolar junction transistor and the transistor 1042 may be a PNP bipolar junction transistor. The above configurations of transistors are examples. Other configurations are within the scope of the disclosure.

Figure 5:
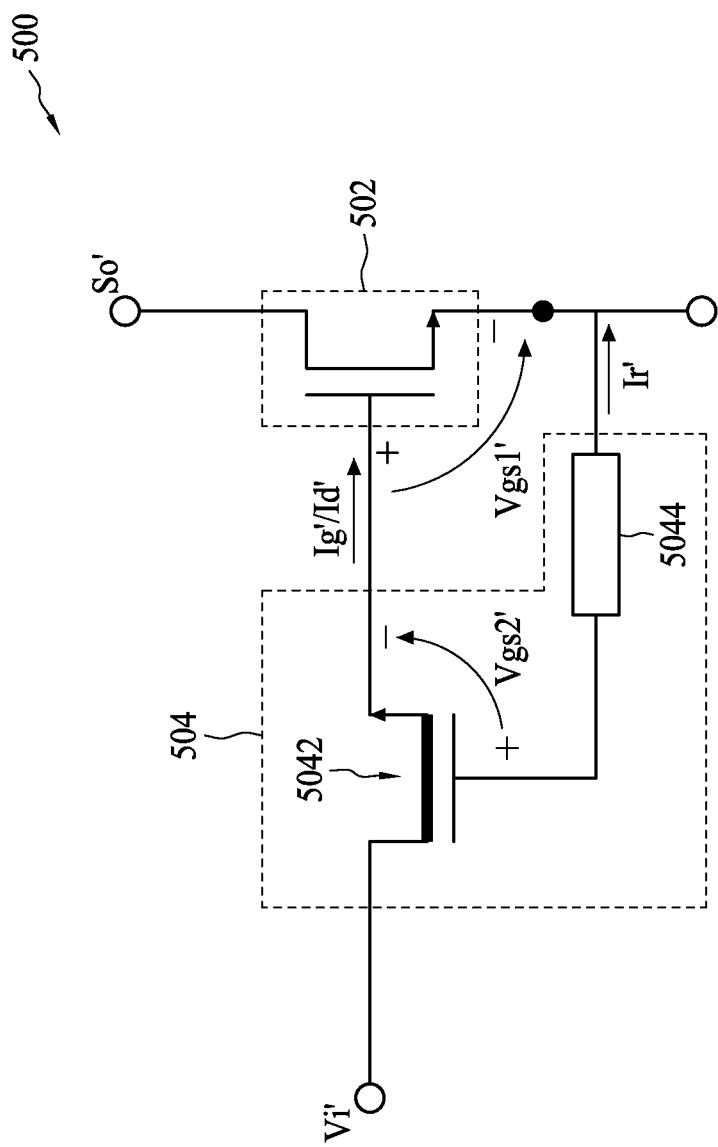
FIG. 5 is a diagram illustrating a semiconductor device in accordance with some embodiments.

FIG. 5 is a diagram illustrating a semiconductor device 500 in accordance with some embodiments. The semiconductor device 500 may be a high voltage power device having group III-V elements. The semiconductor device 500 comprises a first transistor 502 and a clamping circuit 504. The transistor 502 is arranged to generate an output signal So' according to a control signal Vgs1'. The clamping circuit 504 is arranged to generate the control signal Vgs1' according to an input signal Vi', and to clamp the control signal Vgs1' at a predetermined signal level Vp' (see FIG. 6) when the input signal Vi' exceeds the predetermined signal level Vp'. In some embodiments, the clamping circuit 504 comprises a second transistor 5042 and a resistive element 5044. The transistor 502 and the transistor 5042 may be the group III-V transistors. In some embodiments, the transistor 502 is an enhancement-mode high-electron-mobility transistor (E-HEMT) and the transistor 5042 is a depletion-mode high-electron-mobility transistor (D-HEMT). However, this is not a limitation of the embodiments. The resistive element 5044 is arranged to adjust the predetermined signal level Vp'.

In some embodiments, a first connecting terminal of the transistor 5042 is arranged to receive the input signal Vi', and the first connecting terminal may be the drain terminal of the transistor 5042. A second connecting terminal of the transistor 5042 is arranged to couple to a gate terminal of the transistor 502 to output the control signal Vgs1', and the second connecting terminal may be the source terminal of the transistor 5042. A first connecting terminal of the transistor 502 is arranged to output the output signal So', and the first connecting terminal may be the drain terminal of the transistor 502. A first terminal of the resistive element 5044 is coupled to the gate terminal of the transistor 5042, and a second terminal of the resistive element 5044 is coupled to a second connecting terminal of the transistor 502, and the second connecting terminal may be the source terminal of the transistor 502. In some embodiments, an input circuit may be coupled to the drain terminal of the transistor 5042, an output or loading circuit may be coupled to the drain terminal of the transistor 502, and a loading circuit may be coupled to the source terminal of the transistor 502. These circuits are omitted here for brevity.

For illustrative purposes, however, the source terminal of the transistor 502 is coupled to the ground voltage, and the input signal Vi' is a voltage between the drain terminal of the transistor 5042 and the ground voltage. The control signal Vgs1' is a voltage drop between the gate terminal of the transistor 502 and the source terminal of the transistor 502. In some embodiments, the transistor 5042 and the resistive element 5044 are arranged to clamp the control signal Vgs1' at the predetermined signal level Vp' when the input signal Vi' is higher than the predetermined signal level Vp'.

As the transistor 502 is E-HEMT and the transistor 5042 is D-HEMT, the transistor 502 and the transistor 5042 have a positive threshold voltage Vth1' and a negative threshold voltage Vth2', respectively.

In some embodiments, the source terminal and the gate terminal of the transistor 5042 are coupled to the gate terminal and the source terminal of the transistor 502 respectively. Effectively, the bias voltage between the gate-source terminals of the transistor 102 is opposite to the bias voltage between the gate-source terminals of the transistor 1042. However, the resistive element 5044 further provides a voltage drop between the gate terminal of the transistor 5042 and the source terminal of the transistor 502. When the input signal Vi' is higher than the predetermined signal level Vp', the control signal Vgs1' and the gate current Ig' of the transistor 502 will be clamped at the predetermined signal level Vp' and a predetermined current Ip', respectively.

In some embodiments, it is assumed that the voltage drop from the gate terminal to the source terminal of the transistor 5042 is Vgs2', the resistance of the resistive element 5044 is R' the gate current flowing through the resistive element 5044 is Ir', then the following equation (4) is obtained:

$$Vgs1' + Vgs2' = Ir'R' \qquad (4).$$

When the gate current Ig' of the transistor 502 is equal to the drain current Id' of the transistor 5042, equation (5) below is obtained:

$$Ig' \approx A'e^{\frac{q'Vgs1'}{k'T'}} \approx B'(Vgs2 - Vth2')^2 \approx Id'. \qquad (5)$$

Then, the following equation (6) can be obtained based on equations (4) and (5):

$$Ig' \approx A'e^{\frac{q'Vgs1'}{k'T'}} \approx B'(Vgs1' - Ir'R' + Vth2')^2 \approx Id'. \qquad (6)$$

The parameter A' is the gain factor of the transistor 502 while the parameter B' is the gain factor of the transistor 5042. The parameter q' represents the elementary charge of the majority carriers of the transistors 502 and 5042. The parameter k' is the Boltzmann constant. The parameter T' represents temperature.

Figure 6:
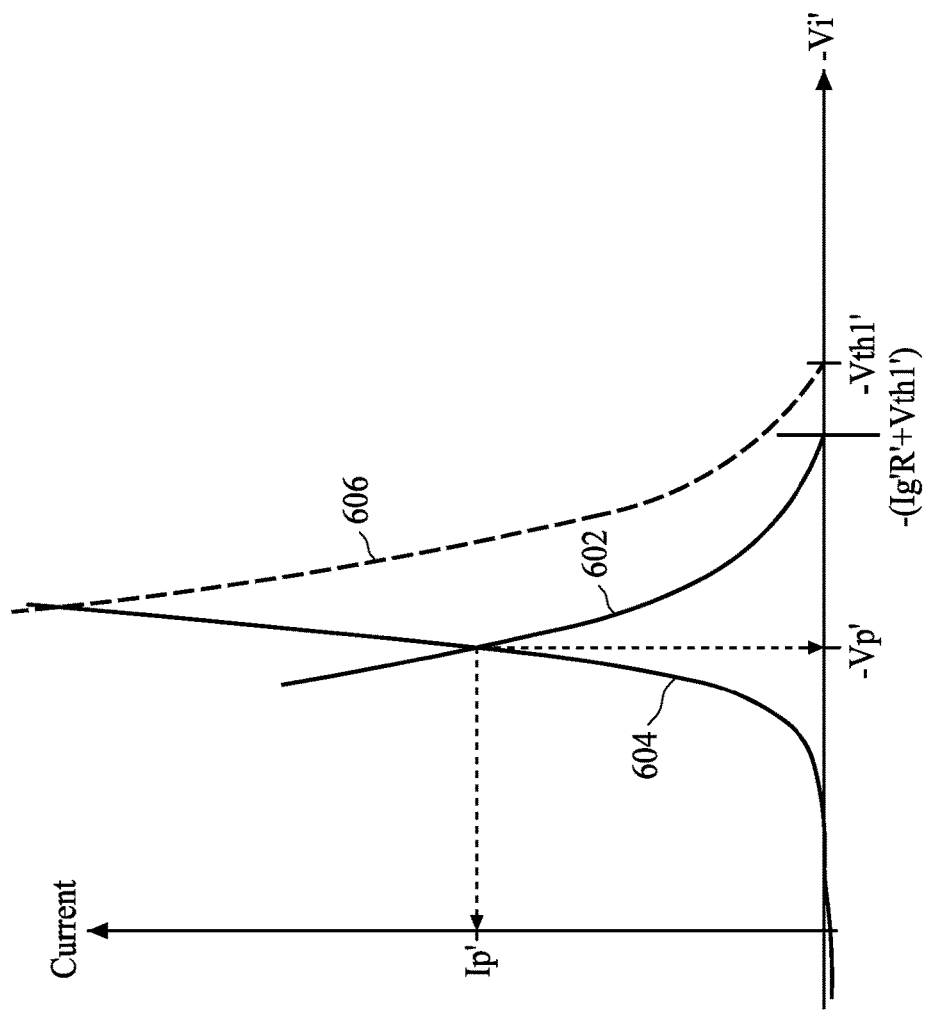
FIG. 6 is a diagram illustrating the characteristics of a gate current of a first transistor and a drain current of a second transistor of the semiconductor device in FIG. 5 in accordance with some embodiments.

Based on the equation (6), the control signal Vgs1' can be solved. When the gate current Ig' of the transistor 502 is equal to the drain current Id' of the transistor 5042, the control signal Vgs1' is regarded as the predetermined signal level Vp', and the predetermined signal level Vp' is a fixed value and depends on the parameters A', B', q', k', T', Vth2', If, and R'. In other words, the predetermined signal level Vp' depends on the threshold voltage Vth2' of the transistor 1042 and the voltage drop Ir'*R' caused by the resistive element 5044 when the parameters A', B', q', k', and T' are fixed values. For example, the predetermined signal level Vp' is adjusted by the voltage drop Ir'*R' as shown in FIG. 6. The resistive element 5044 in FIG. 5 is not a limitation of the embodiments. The resistive element 5044 may be replaced with other circuit having the similar electrical characteristic. In some embodiments, the resistive element 5044 may be a passive device. The passive device may be a combination of a resistive device, an inductive device, and/or a capacitive device. In some embodiments, the resistive element 5044 may further comprise an active device other than the resistive element 5044. The active device may comprise one or more transistor. In some embodiments, the resistive element 5044 may be an adjustable resistor being controlled to adjust the predetermined signal level Vp' after the semiconductor device 500 is fabricated.

FIG. 6 is a diagram illustrating the characteristics of the gate current Ig' of the transistor 502 and the drain current Id' of the transistor 5042 in accordance with some embodiments. Curve 602 represents the load line of the gate current Ig' of the transistor 502. Curve 604 represents the load line of the drain current Id' of the transistor 5042. For illustrative purposes, the curve 606 is also shown, in which the curve 606 represents the load line of the gate current Ig' of the transistor 502 without the resistive element 5044.

In some embodiments, when the gate current Ig' of the transistor 502 equals the drain current Id' of the transistor 5042, i.e. when the gate current Ig' and the drain current Id' are equal to the predetermined current Ip', the control signal Vgs1' is clamped at the predetermined signal level Vp'. For example, when the resistive element 5044 is coupled between the gate terminal of the transistor 5042 and the source terminal of the transistor 502, the load line of the gate current Ig' of the transistor 502 is moved to 602 from the 606. Accordingly, in comparison to the predetermined signal level Vp and the predetermined current Ip as shown in FIG. 2, the predetermined signal level Vp' and the predetermined current Ip' are decreased when the resistive element 5044 is coupled between the gate terminal of the transistor 5042 and the source terminal of the transistor 502. Accordingly, when the input signal Vi' increases to a voltage level higher than the adjusted signal level Vp', the control signal Vgs1' and the gate current Ig' of the transistor 502 will continuously be clamped at or locked to the adjusted signal level Vp' and the adjusted current Ip', respectively.

Accordingly, when a high voltage spike is inputted to the clamping circuit 504 (i.e. the drain terminal of the transistor 5042), the clamping circuit 504 will limit the maximum control signal Vgs1' and the maximum gate current Ig' of the transistor 502 to the adjusted signal level Vp' and the adjusted current Ip' respectively to protect the transistor 502.

For the semiconductor device 500, when the gate width of the transistor 5042 is adjusted to minimize the input resistance of the semiconductor device 500, the gate width adjustment does not introduce a large variation in the clamping voltage, i.e., the predetermined signal level Vp', of the clamping circuit 504. This feature is similar to the above semiconductor device 100, and the detailed description is omitted here for brevity.

In FIG. 5, the transistor 502 is an N-type E-HEMT and the transistor 5042 is an N-type D-HEMT. However, this is not a limitation of the embodiments. In some embodiments, the transistor 502 may be an N-type E-HEMT and the transistor 5042 may be a P-type D-HEMT. In some embodiments, the transistor 502 may be a P-type E-HEMT and the transistor 5042 may be an N-type D-HEMT. In some embodiments, the transistor 502 may be a P-type E-HEMT and the transistor 5042 may be a P-type D-HEMT. In some embodiments, the transistor 502 and the transistor 5042 comprise vertical layered heterostructures in which the vertical layered heterostructures are implemented by group-III nitride (also referred to as III-nitride or III-N) semiconductor material. In some embodiments, the transistor 502 may be an N-type field-effect transistor and the transistor 5042 may be a P-type field-effect transistor. In some embodiments, the transistor 502 may be a P-type field-effect transistor and the transistor 5042 may be an N-type field-effect transistor. In some embodiments, the transistor 502 may be a P-type field-effect transistor and the transistor 5042 may be a P-type field-effect transistor. In some embodiments, the transistor 502 may be an NPN bipolar junction transistor and the transistor 5042 may be a PNP bipolar junction transistor. In some embodiments, the transistor 502 may be a PNP bipolar junction transistor and the transistor 5042 may be an NPN bipolar junction transistor. In some embodiments, the transistor 502 may be a PNP bipolar junction transistor and the transistor 5042 may be a PNP bipolar junction transistor. The above configurations of transistors are examples. Other configurations are within the scope of the disclosure.

Figure 7:
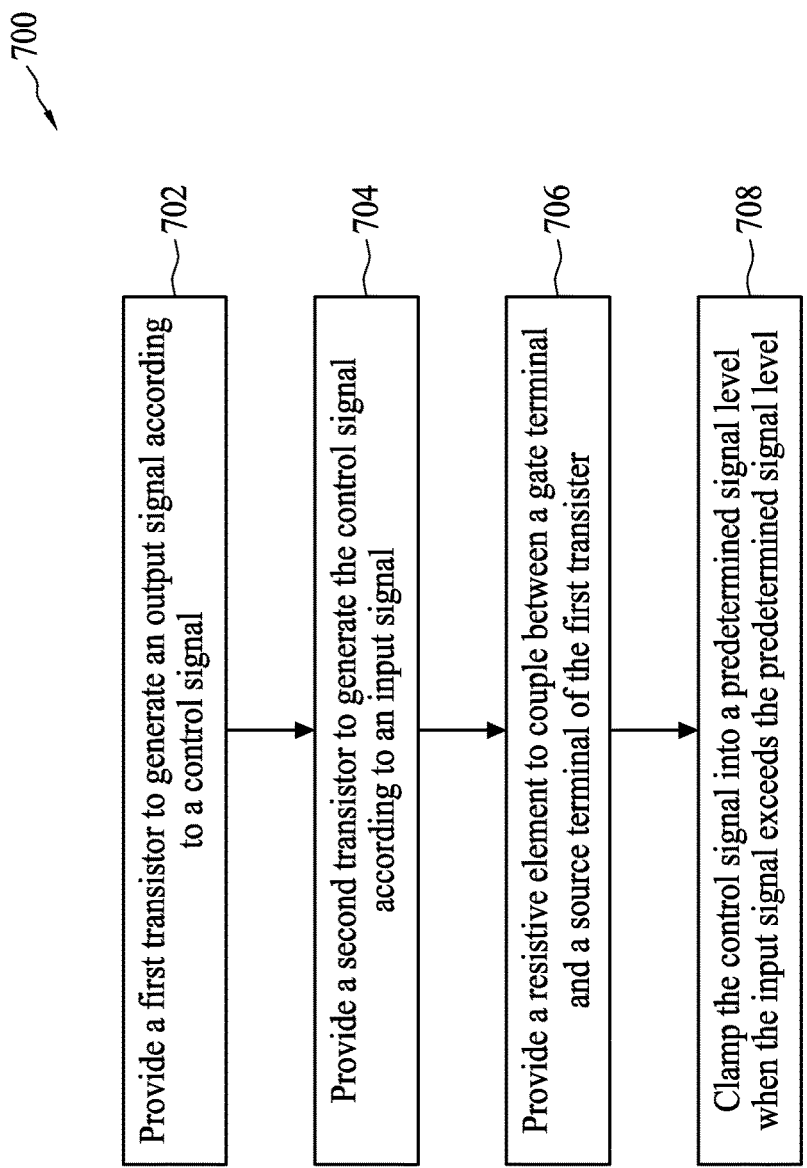
FIG. 7 is a flow diagram illustrating a circuit protecting method in accordance with some embodiments.

FIG. 7 is a flow diagram illustrating a circuit protecting method 700 in accordance with some embodiments. The circuit protecting method 700 is capable of protecting a high power device. For example, the circuit protecting method 700 can be applied in the above semiconductor devices 100 and 500. For brevity, the circuit protecting method 700 is described in conjunction with the semiconductor device 500. Referring to FIG. 7, in operation 702, the transistor 502 is provided to generate the output signal So' according to the control signal Vgs1'.

In operation 704, the transistor 5042 is provided to generate the control signal Vgs1' according to an input signal Vi'.

In operation 706, the resistive element 5044 is provided to couple between the gate terminal of the transistor 5042 and the source terminal of the transistor 502.

In operation 708, the transistor 5042 and the resistive element 5044 are arranged to clamp the control signal Vgs1' at the predetermined signal level Vp' when the input signal Vi' exceeds the predetermined signal level Vp'. In some embodiments, the predetermined signal level Vp' depends on the threshold voltage Vth2' of the transistor 5042. The predetermined signal level Vp' may be adjusted by the resistance R' of the resistive element 5044.

When a high voltage spike is inputted to the clamping circuit 504 (i.e. the drain terminal of the transistor 5042), the circuit protecting method 700 is capable of limiting the maximum control signal Vgs1' and the maximum gate current Ig' of the transistor 502 to the adjusted signal level Vp' and the adjusted current Ip', respectively to protect the transistor 502.

Figure 8:
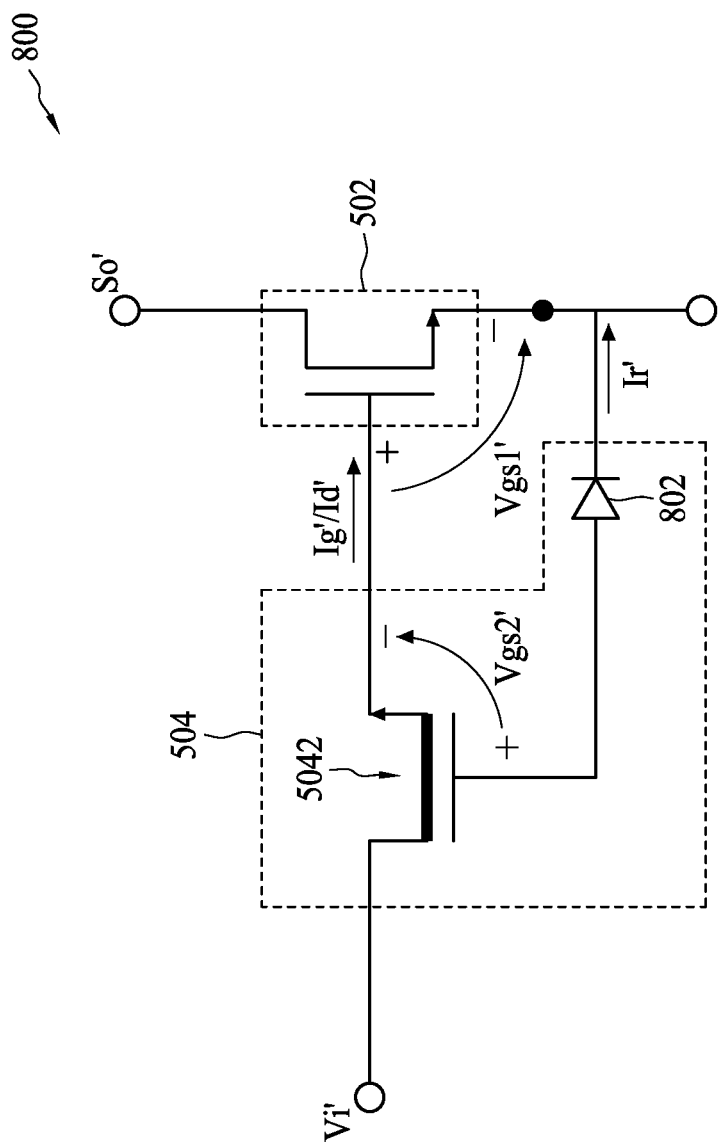
FIG. 8 is a diagram illustrating a semiconductor device in accordance with some embodiments.

The clamping circuits 104, 504 in FIG. 1 and FIG. 5 are not the limitations of the embodiments. The clamping circuits 104, 504 may be replaced with other voltage clamping circuits. It will be understood that the clamping circuit 104 (or 504) can include more than one transistor. The semiconductor device 100 (or 500) can also include more than one clamping circuit 104 (or 504). For example, the clamping circuit 104 (or 504) may comprise more than one D-HEMTs. The clamping circuit 104 may further comprise other active or passive devices other than the D-HEMT. FIG. 8 is a diagram illustrating a semiconductor device 800 in accordance with some embodiments. In comparison to the semiconductor device 500 in FIG. 5, the resistive element 5044 is replaced with a diode 802 in the semiconductor device 800, and other devices in the semiconductor device 800 are labeled with the similar numerals for brevity. According to some embodiments, the anode of the diode 802 is coupled to the gate terminal of the transistor 5042, and the cathode of the diode 802 is coupled to the source terminal of the transistor 502. Therefore, the diode 802 is forward biased from the gate terminal of the transistor 5042 to the source terminal of the transistor 502. The diode 802 is to provide a voltage drop from the gate terminal of the transistor 5042 to the source terminal of the transistor 502. The voltage drop is arranged to adjust the predetermined signal level Vp'. When the input signal Vi' is higher than the predetermined signal level Vp', the control signal Vgs1' and the gate current Ig' of the transistor 502 will be clamped at the predetermined signal level Vp' and the predetermined current Ip', respectively. The detailed operation of the semiconductor device 800 is similar to the operation of the semiconductor device 500 described in the above paragraphs, and the detailed description of the features and the advantages are omitted here for brevity.

Briefly, when the bias voltage between the gate-source terminals of the E-HEMT (e.g. 102) is opposite to the bias voltage between the gate-source terminals of the D-HEMT (e.g. 1042), the gate-source voltage drop (e.g. Vgs1) of the E-HEMT will be clamped by the threshold voltage (e.g.

Vth2) of the D-HEMT. As a result, when a high voltage spike is inputted to the E-HEMT, the D-HEMT can limit the gate-source voltage drop of the E-HEMT to the predetermined signal level Vp to protect the E-HEMT. The predetermined signal level Vp can be adjusted by using a resistor connected between the gate terminal of the D-HEMT and the source terminal of the E-HEMT. Moreover, the input resistance of the E-HEMT can be adjusted by the gate width of the D-HEMT without affecting the predetermined signal level Vp.

In some embodiments of the present disclosure, a semiconductor device is disclosed. The semiconductor device comprises a first transistor and a clamping circuit. The first transistor is arranged to generate an output signal according to a control signal. The clamping circuit is arranged to generate the control signal according to an input signal, and to clamp the control signal to a predetermined signal level when the input signal exceeds the predetermined signal level.

In some embodiments of the present disclosure, a semiconductor device is disclosed. The semiconductor device comprises a first transistor and a second transistor. The first transistor is arranged to generate an output signal according to a control signal. The second transistor is arranged to clamp the control signal to a predetermined signal level. The predetermined signal level is depended on a threshold voltage of the second transistor.

In some embodiments of the present disclosure, a circuit protecting method is disclosed. The circuit protecting method comprises: providing a first transistor to generate an output signal according to a control signal; providing a second transistor to generate the control signal according to an input signal; and using the second transistor to clamp the control signal to a predetermined signal level when the input signal exceeds the predetermined signal level.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a first transistor having a first source terminal, a first drain terminal, and a first gate terminal;
a second transistor having a second source terminal, a second drain terminal, and a second gate terminal, wherein the first transistor includes an enhancement-mode high-electron-mobility transistor (E-HEMT) and the second transistor includes a depletion-mode high-electron-mobility transistor (D-HEMT); and
an element coupled between the first source terminal and the second gate terminal, wherein the element is selected from the group consisting of a resistive element and a diode, and
wherein the second source terminal is coupled to the first gate terminal and the first source terminal is coupled to the second gate terminal, wherein the first transistor has a first threshold voltage, and the second transistor has a second threshold voltage different from the first threshold voltage.

2. The device of claim 1, wherein the first threshold voltage and the second threshold voltage have different polarities.

3. The device of claim 2, wherein the first threshold voltage is a positive voltage and the second threshold voltage is a negative voltage.

4. The device of claim 1, wherein the first transistor and the second transistor are integrated into a single chip.

5. The device of claim 1, wherein each of the first transistor and the second transistor comprises vertical layered heterostructures implemented by group-III nitride semiconductor material.

6. The device of claim 1, wherein the element selected is the diode.

7. The device of claim 1, wherein the element selected is the resistive element.

8. The device of claim 1, wherein the first transistor is arranged to generate an output signal according to a control signal, and
wherein the second transistor and the element form part of a clamping circuit, the clamping circuit arranged to generate the control signal according to an input signal and to clamp the control signal to a predetermined signal level when the input signal exceeds the predetermined signal level.

9. The device of claim 8, wherein the control signal is a voltage drop between the first gate terminal and the first source terminal of the first transistor.

10. A device, comprising:
a first transistor, arranged to generate an output signal according to a control signal; and
a clamping circuit including a second transistor and a diode, wherein the clamping circuit is arranged to generate the control signal according to an input signal, and to clamp the control signal to a predetermined signal level when the input signal exceeds the predetermined signal level, and wherein the diode is coupled between a gate terminal of the second transistor and a source terminal of the first transistor.

11. The device of claim 10, wherein an anode of the diode is coupled to the gate terminal of the second transistor and a cathode of the diode is coupled to the source terminal of the first transistor.

12. The device of claim 10, wherein the control signal is a voltage drop between a gate terminal of the first transistor and the source terminal of the first transistor, and the clamping circuit is arranged to clamp the control signal to the predetermined signal level when the input signal is higher than the predetermined signal level.

13. The device of claim 10, wherein the clamping circuit is arranged to clamp a gate current on a gate terminal of the first transistor to a predetermined current when the input signal is higher than the predetermined signal level.

14. The device of claim 10, wherein each of the first transistor and the second transistor comprises a group III-V transistor.

15. The device of claim 10, wherein the first transistor is an enhancement-mode high-electron-mobility transistor (E-HEMT) and the second transistor is a depletion-mode high-electron-mobility transistor (D-HEMT).

16. A device, comprising:
a first transistor having a first source terminal, a first drain terminal, and a first gate terminal; and a second transistor having a second source terminal, a second drain terminal, and a second gate terminal, an element coupled between the first source terminal and the second gate terminal, wherein the element includes a resistive element or a diode, wherein the second source terminal is coupled to the first gate terminal, wherein the first and second transistors are configured such that a voltage drop between the first gate terminal and the first source terminal is clamped to a predetermined signal level when an input signal to the second drain terminal exceeds a predetermined voltage level.

17. The device of claim 16, wherein the first source terminal is directly coupled to the second gate terminal.

18. The device of claim 16, wherein the first transistor is an enhancement-mode high-electron-mobility transistor (E-HEMT) and the second transistor is a depletion-mode high-electron-mobility transistor (D-HEMT).

19. The device of claim 16, wherein each of the first transistor and the second transistor comprises a group III-V transistor.

20. The device of claim 16, wherein each of the first transistor and the second transistor comprises a field-effect transistor.

* * * * *